United States Patent
Yoon et al.

(10) Patent No.: US 6,218,301 B1
(45) Date of Patent: Apr. 17, 2001

(54) DEPOSITION OF TUNGSTEN FILMS FROM W(CO)$_6$

(75) Inventors: Hyungsuk Alexander Yoon, Santa Clara; Michael X. Yang, Fremont; Ming Xi, Milpitas, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/628,592

(22) Filed: Jul. 31, 2000

(51) Int. Cl.$^7$ .................................................. H01L 21/44
(52) U.S. Cl. .................... 438/685; 438/682; 438/683; 438/934; 438/974
(58) Field of Search .................... 438/685, 682, 438/683, 934, 974

(56) References Cited

U.S. PATENT DOCUMENTS

| | | | |
|---|---|---|---|
| 5,332,691 | * 7/1994 | Kinoshita et al. | 437/192 |
| 5,436,200 | * 7/1995 | Tanaka | 437/192 |
| 5,976,975 | 11/1999 | Joshi et al. | 438/672 |
| 5,990,007 | * 11/1999 | Kajita et al. | 438/680 |
| 6,008,128 | * 12/1999 | Habuka et al. | 438/695 |
| 6,030,893 | 2/2000 | Lo et al. | 438/652 |
| 6,037,263 | 3/2000 | Chang | 438/712 |
| 6,069,094 | * 5/2000 | Matsumura et al. | 438/788 |
| 6,107,197 | * 8/2000 | Suzuki | 438/677 |

* cited by examiner

Primary Examiner—John F. Niebling
Assistant Examiner—David A Zarneke
(74) Attorney, Agent, or Firm—Thomason, Moser & Patterson, LLP

(57) ABSTRACT

A method of forming tungsten films on oxide layers is disclosed. The tungsten films are formed on the oxide layers by treating the oxide using a silane based gas mixture followed by the thermal decomposition of a W(CO)$_6$ precursor. After the W(CO)$_6$ precursor is thermally decomposed, additional layer of tungsten may be optionally formed thereon from the thermal decomposition of tungsten hexafluoride (WF$_6$).

72 Claims, 2 Drawing Sheets

DEPOSITION OF TUNGSTEN FILMS FROM W(CO)$_6$

BACKGROUND OF THE DISCLOSURE

1. Field of the Invention

The invention relates to a method of tungsten film deposition and, more particularly, to a method of forming a tungsten film having good film morphology and low resistivity.

2. Description of the Background Art

In the manufacture of integrated circuits, tungsten (W) films are often used as contact metallization or plug metallization for aluminum (Al) interconnect schemes. Tungsten (W) films may also be used as a diffusion barrier for copper (Cu) metallization.

Tungsten layers are typically formed using chemical vapor deposition (CVD) techniques. For example, tungsten may be formed by thermally decomposing a tungsten-containing precursor. For example, W may be formed when tungsten hexafluoride (WF$_6$) decomposes.

However, when tungsten films formed from the decomposition of WF$_6$, are deposited on oxides (e.g., silicon dioxide (SiO$_2$)) poor film morphology may occur. The morphology of a film refers to its thickness, film continuity, surface roughness, and grain structure. For example, tungsten films formed on silicon dioxide (SiO$_2$) from the thermal decomposition of WF$_6$ typically may have a discontinuous film morphology. Such discontinuous film morphology is undesirable because it may affect the electrical characteristics of the tungsten film increasing the resistivity thereof.

Therefore, a need exists in the art for a method of forming tungsten films having good film morphology and low resistivity.

SUMMARY OF THE INVENTION

A method of forming tungsten films on oxide layers is provided. The tungsten films are formed on the oxide layers by treating the oxide using a silane based gas mixture followed by the thermal decomposition of a W(CO)$_6$ precursor. After the W(CO)$_6$ precursor is thermally decomposed, an additional layer of tungsten may be optionally formed thereon from the thermal decomposition of tungsten hexafluoride (WF$_6$).

The tungsten film formation is compatible with integrated circuit fabrication processes. In one integrated circuit fabrication process, the tungsten film is used as a barrier layer for copper metallization (Cu). For a copper metallization process, a preferred process sequence includes providing a substrate having a dielectric material (e.g., oxide) thereon. The dielectric material has vias therein. A tungsten film is formed on the dielectric material by treating the dielectric material using a silane based gas mixture followed by the thermal decomposition of a W(CO)$_6$ precursor. After the tungsten film is formed on the dielectric material, the integrated circuit structure is completed by filling the vias with a conductive material, such as, for example, copper (Cu).

BRIEF DESCRIPTION OF THE DRAWINGS

The teachings of the present invention can be readily understood by considering the following detailed description in conjunction with the accompanying drawings, in which.

DETAILED DESCRIPTION

Figure 1:
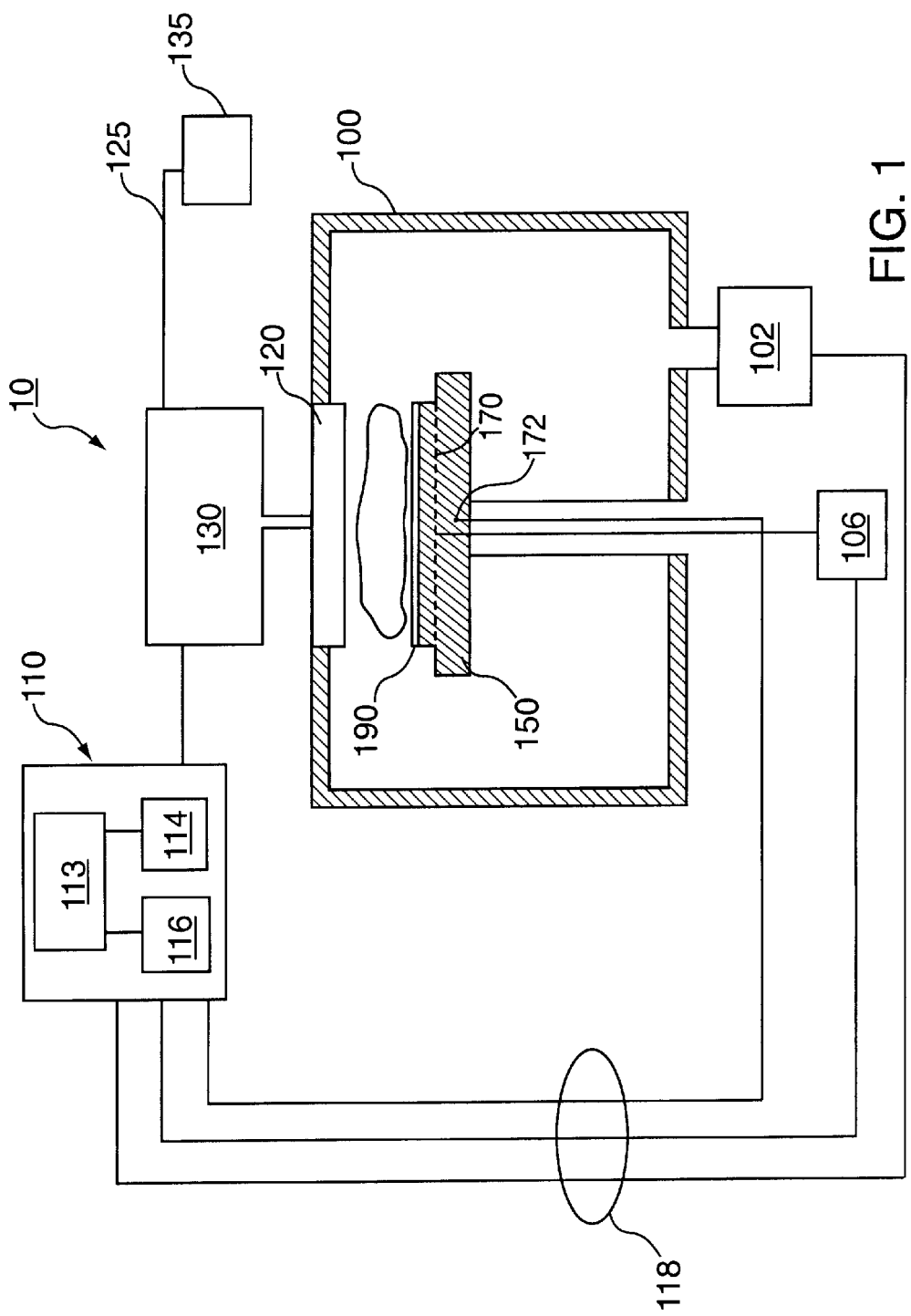
FIG. 1 depicts a schematic illustration of an apparatus that can be used for the practice of embodiments described herein.

FIG. 1 is a schematic representation of a wafer processing system 10 that can be used to perform tungsten (W) film formation in accordance with embodiments described herein. System 10 typically comprises a process chamber 100, a gas panel 130, a control unit 110, along with other hardware components such as power supplies 106 and vacuum pumps 102. One example of the process chamber 100 has been previously described in commonly assigned U.S. patent application Ser. No. 09/211,998, entitled "High Temperature Chemical Vapor Deposition Chamber", filed Dec. 14, 1998, and is herein incorporated by reference. The salient features of this system 10 are briefly described below. Chamber 100

The process chamber 100 generally houses a support pedestal 150, which is used to support a substrate such as a semiconductor wafer 190. This pedestal 150 can typically be moved in a vertical direction inside the chamber 100 using a displacement mechanism (not shown).

Depending on the specific process, the wafer 190 can be heated to some desired temperature prior to the tungsten (W) film deposition. For example, the wafer support pedestal 150 is heated by an embedded heater element 170. The pedestal 150 may be resistively heated by applying an electric current from an AC power supply 106 to the heater element 170. The wafer 190 is, in turn, heated by the pedestal 150.

A temperature sensor 172, such as a thermocouple, is also embedded in the wafer support pedestal 150 to monitor the temperature of the pedestal 150 in a conventional manner. The measured temperature is used in a feedback loop to control the power supplied to the heater element 170, such that the wafer temperature can be maintained or controlled at a desired temperature which is suitable for the particular process application. The pedestal is optionally heated using radiant heat (not shown).

A vacuum pump 102, is used to evacuate the process chamber 100 and to maintain the proper gas flows and pressure inside the chamber 100. A showerhead 120, through which process gases are introduced into the chamber 100, is located above the wafer support pedestal 150. The showerhead 120 is coupled to a gas panel 130, which controls and supplies various gases used in different steps of the process sequence.

In the present embodiment, tungsten film deposition is accomplished via thermal decomposition of, for example, a W(CO)$_6$ precursor. W(CO)$_6$ may be introduced into the process chamber 100 under the control of gas panel 130. The W(CO)$_6$ may be introduced into the process chamber as a gas with a regulated flow via heated line 125 and heated ampoule 135.

Proper control and regulation of the gas flows through the gas panel 130 is performed by mass flow controllers (not shown) and the controller unit 110. The showerhead 120 allows process gases from the gas panel 130 to be uniformly introduced and distributed in the process chamber 100.

Illustratively, the control unit 110 comprises a central processing unit (CPU) 113, support circuitry 114, and memories containing associated control software 116. The control unit 110 is responsible for automated control of the numerous steps required for wafer processing—such as wafer transport, gas flow control, temperature control, chamber evacuation, and other steps. Bi-directional communications between the control unit 110 and the various components of the wafer processing system 10 are handled through numerous signal cables collectively referred to as signal buses 118, some of which are illustrated in FIG. 1.

The central processing unit (CPU) 113 may be one of any form of general purpose computer processor that can be used in an industrial setting for controlling process chambers as well as sub-processors. The computer may use any suitable memory, such as random access memory, read only memory, floppy disk drive, hard drive, or any other form of digital storage, local or remote. Various support circuits may be coupled to the CPU for supporting the processor in a conventional manner. Process sequence routines as required may be stored in the memory or executed by a second CPU that is remotely located.

The process sequence routines are executed after the substrate 190 is positioned on the wafer support pedestal 150. The process sequence routines, when executed, transform the general purpose computer into a specific process computer that controls the chamber operation so that the deposition process is performed. Alternatively, the chamber operation may be controlled using remotely located hardware, as an application specific integrated circuit or other type of hardware implementation, or a combination of software or hardware.

Tungsten (W) Film Deposition

The following embodiment is a method for tungsten (W) film deposition, which advantageously provides tungsten films with good film morphology and low film resistivity.

Figure 2A:
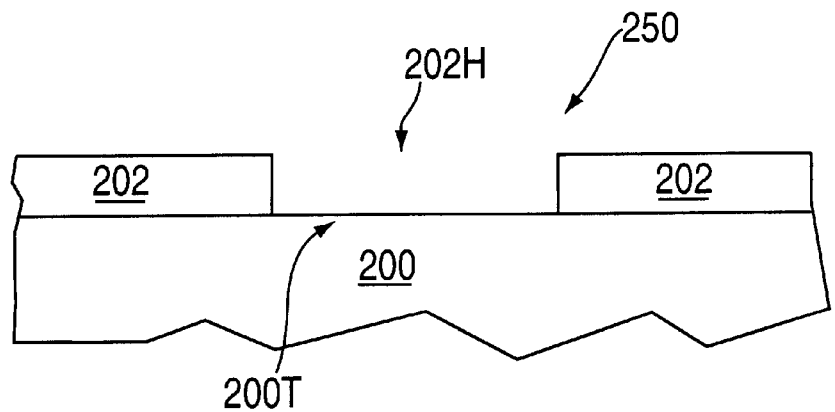
FIGS. 2a–2c depict schematic cross-sectional views of an integrated circuit structure at different stages of a fabrication sequence incorporating a tungsten (W) film.
Figure 2B:
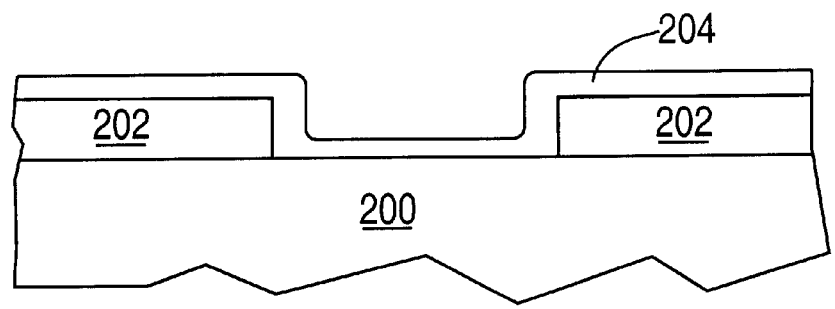
Figure 2C:
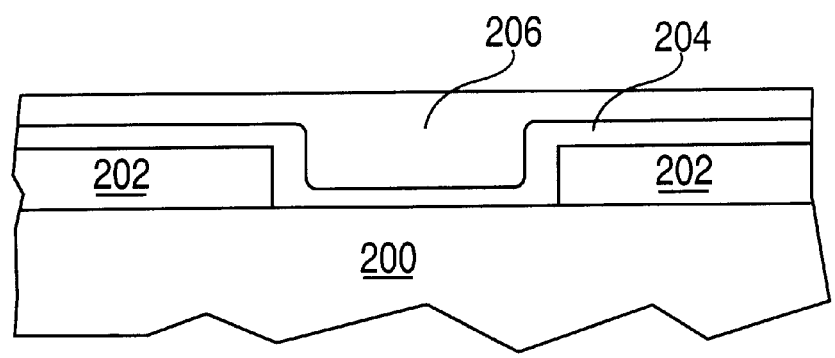

FIGS. 2a–2c illustrate an integrated circuit structure at different stages of a fabrication sequence, incorporating a tungsten diffusion barrier. In general, the substrate 200 refers to any workpiece upon which film processing is performed, and a substrate structure 250 is used to generally denote the substrate 200 as well as other material layers formed on the substrate 200.

Depending on the specific stage of processing, the substrate 200 may be a silicon semiconductor wafer, or other material layer, which has been formed on the wafer. FIG. 2a, for example, shows a cross-sectional view of a substrate structure 250, having a material layer 202 thereon. In this particular illustration, the material layer 202 may be an oxide (e.g., silicon dioxide, fluorosilicate glass (FSG), undoped silicate glass (USG)). The material layer 202 has been conventionally formed and patterned to provide a contact hole 202H having sidewalls 202S, and extending to the top surface 200T of the substrate 200.

Prior to tungsten (W) film deposition, the substrate structure 250 is treated with a gas mixture comprising a silicon compound. The silicon compound, for example, may be selected from the group of silane ($SiH_4$), disilane ($Si_2H_6$), dichlorosilane ($SiCl_2H_2$), and combinations thereof. Carrier gases such as argon (Ar), nitrogen ($N_2$), and hydrogen ($H_2$), among others may be mixed with the silicon compound.

In general, the following process parameters can be used to treat the substrate structure 250 with the silicon compound in a process chamber similar to that shown in FIG. 1. The process parameters range from a wafer temperature of about 250° C. to about 550° C., a chamber pressure of about 0.5 torr to about 2 torr, a silicon compound gas flow rate of about 5 sccm to about 50 sccm, and a carrier gas flow rate of about 100 sccm to about 1000 sccm.

The substrate structure 250 is treated for about 5 seconds to about 30 seconds. The treatment of the substrate structure 250 with the silicon compound is believed to improve the nucleation of tungsten (W) thereon. Additionally, it is believed that residual silicon compound may remain in the process chamber after the substrate structure is treated, so that some silicon (Si) may be incorporated in the tungsten film.

After the substrate structure 250 is treated, a tungsten film 204 is formed thereon as shown in FIG. 3b. The tungsten (W) film 204 is formed by thermally decomposing a $W(CO)_6$ precursor. Carrier gases such as argon (Ar), and nitrogen ($N_2$), among others may be mixed with the $W(CO)_6$ precursor.

In general, the following deposition process parameters can be used to form the tungsten (W) film 204 in a deposition chamber similar to that shown in FIG. 1. The process parameters range from a wafer temperature of about 250° C. to about 550° C., a chamber pressure of about 0.5 torr to about 2 torr, a $W(CO)_6$ precursor flow rate of about 2 sccm to about 20 sccm, and a carrier gas flow rate of about 100 sccm to about 1000 sccm. The above process parameters provide a deposition rate for the tungsten (W) film in a range of about 200 Å/min to about 400 Å/min when implemented on a 200 mm (millimeter) substrate in a deposition chamber available from Applied Materials, Inc., located in Santa Clara, Calif.

Other deposition chambers are within the scope of the invention, and the parameters listed above may vary according to the particular deposition chamber used to form the tungsten (W) film. For example, other deposition chambers may have a larger (e.g., configured to accommodate 300 mm substrates) or smaller volume, requiring gas flow rates that are larger or smaller than those recited for deposition chambers available from Applied Materials, Inc.

The thermal decomposition of the $W(CO)_6$ precursor advantageously forms tungsten (W) films with a smooth continuous film morphology. The thickness of the tungsten (W) film 204 is variable depending on the specific stage of processing. Typically, the tungsten (W) film 204 is deposited to a thickness of about 50 Å to about 200 Å.

Additional tungsten (W) layers may optionally be deposited over the film formed from the decomposition of the $W(CO)_6$ precursor, so as to form thick tungsten (W) layers having a desired thickness up to about 4000 Å. The subsequently deposited tungsten (W) films may optionally be formed from the thermal decomposition tungsten hexafluoride ($WF_6$). Carrier gases such as argon (Ar), and nitrogen ($N_2$), among others may be mixed with the tungsten hexafluoride ($WF_6$).

In general, the following deposition process parameters can be used to form the tungsten (W) films from the thermal decomposition of tungsten hexafluoride ($WF_6$) in a deposition chamber similar to that shown in FIG. 1. The process parameters range from a wafer temperature of about 300° C. to about 500° C., a chamber pressure of about 300 torr to about 400 torr, a tungsten hexafluoride ($WF_6$) flow rate of about 200 sccm to about 400 sccm, and a carrier gas flow rate of about 100 sccm to about 1000 sccm. The above process parameters provide a deposition rate for the tungsten (W) film at a rate greater than about 5000 Å/min when implemented on a 200 mm (millimeter) substrate in a deposition chamber available from Applied Materials, Inc., located in Santa Clara, Calif.

Referring to FIG. 3c, after the tungsten (W) film 204 is deposited, the holes 202H are filled with a conductive material 206 such as, for example, aluminum (Al), copper (Cu), and combinations thereof, among others. The conductive material 206 may be deposited using chemical vapor deposition (CVD), physical vapor deposition (PVD), electroplating, or combinations thereof.

Although several preferred embodiments which incorporate the teachings of the present invention have been shown and described in detail, those skilled in the art can readily devise many other varied embodiments that still incorporate these teachings.

What is claimed is:

1. A method of thin film deposition for integrated circuit fabrication, comprising the steps of:
   (a) treating a substrate with a dielectric material thereon using a gas mixture comprising a silicon compound; and
   (b) forming one or more tungsten (W) films on the substrate.

2. The method of claim 1 wherein the silicon compound is selected from the group of silane ($SiH_4$), disilane ($Si_2H_6$) dichlorosilane ($SiCl_2H_2$), and combinations thereof.

3. The method of claim 1 wherein the gas mixture of step (a) further comprises a carrier gas.

4. The method of claim 3 wherein the carrier gas is selected from the group of argon (Ar), nitrogen ($N_2$), hydrogen ($H_2$), and combinations thereof.

5. The method of claim 1 wherein step (a) is performed at a temperature in a range of about 250° C. to about 550° C.

6. The method of claim 1 wherein step (a) is performed for a time in a range of about 5 seconds to about 30 seconds.

7. The method of claim 1 wherein the silicon compound has a flow rate in a range of about 5 sccm to about 50 sccm.

8. The method of claim 1 wherein step (a) is performed at a pressure in a range of about 0.5 torr to about 2 torr.

9. The method of claim 3 wherein the carrier gas has a flow rate in a range of about 100 sccm to about 1000 sccm.

10. The method of claim 1 wherein step (b), comprises:
    positioning the substrate in a deposition chamber;
    providing a gas mixture to the deposition chamber wherein the gas mixture comprises a $W(CO)_6$ precursor; and
    thermally decomposing the $W(CO)_6$ precursor to form a tungsten film on the substrate.

11. The method of claim 10 wherein the gas mixture further comprises a carrier gas.

12. The method of claim 11 wherein the carrier gas is selected from the group of argon (Ar), nitrogen ($N_2$), and combinations thereof.

13. The method of claim 10 wherein the deposition chamber is heated to a temperature of between about 250° C. to about 550° C.

14. The method of claim 10 wherein the deposition chamber is maintained at a pressure between about 0.5 torr to about 2 torr.

15. The method of claim 10 wherein $W(CO)_6$ precursor is provided to the deposition chamber at a flow rate in a range of about 2 sccm to about 20 sccm.

16. The method of claim 11 wherein the carrier gas is provided to the deposition chamber at a flow rate in a range of about 100 sccm to about 1000 sccm.

17. The method of claim 1 wherein step (b), comprises:
    positioning the substrate in a deposition chamber;
    providing a gas mixture to the deposition chamber wherein the gas mixture comprises a tungsten hexafluoride ($WF_6$) precursor; and
    thermally decomposing the $WF_6$ precursor to form a tungsten film on the substrate.

18. The method of claim 17 wherein the gas mixture further comprises a carrier gas.

19. The method of claim 17 wherein the deposition chamber is maintained at a pressure in a range of about 300 torr to about 400 torr.

20. The method of claim 17 the $WF_6$ precursor is provided to the deposition chamber at a flow rate in a range of about 200 sccm to about 400 sccm.

21. The method of claim 18 wherein the carrier gas is selected from the group of argon (Ar), nitrogen ($N_2$), and combinations thereof.

22. The method of claim 21 wherein the carrier gas is provided to the process chamber at a flow rate in a range of about 100 sccm to about 1000 sccm.

23. The method of claim 17 wherein the process chamber is maintained at a temperature in a range of about 300° C. to about 500° C.

24. A method of forming a device, comprising:
    (a) providing a substrate having a dielectric layer thereon, wherein the dielectric layer has vias therein;
    (b) treating the dielectric layer using a gas mixture comprising a silicon compound; and
    (c) forming one or more tungsten (W) films on the dielectric layer; and
    (d) filling the vias with a conductive material.

25. The method of claim 24 wherein the conductive material filling the vias has a resistivity less than about 10 $\mu\Omega$-cm (microohms-centimeters).

26. The method of claim 24 wherein the dielectric layer is selected from the group of silicon dioxide, fluorosilicate glass (FSG), undoped silicate glass (USG), and combinations thereof.

27. The method of claim 24 wherein the conductive material filling the vias is selected from the group of copper (Cu), aluminum (Al), and combinations thereof.

28. The method of claim 24 wherein the silicon compound is selected from the group of silane ($SiH_4$), disilane ($Si_2H_6$), dichlorosilane ($SiCl_2H_2$), and combinations thereof.

29. The method of claim 24 wherein the gas mixture of step (b) further comprises a carrier gas.

30. The method of claim 29 wherein the carrier gas is selected from the group of argon (Ar), nitrogen ($N_2$), hydrogen ($H_2$), and combinations thereof.

31. The method of claim 24 wherein step (b) is performed at a temperature in a range of about 250° C. to about 550° C.

32. The method of claim 24 wherein step (b) is performed for a time in a range of about 5 seconds to about 30 seconds.

33. The method of claim 24 wherein the silicon compound has a flow rate in a range of about 5 sccm to about 50 sccm.

34. The method of claim 24 wherein step (b) is performed at a pressure in a range of about 0.5 torr to about 2 torr.

35. The method of claim 29 wherein the carrier gas has a flow rate in a range of about 100 sccm to about 1000 sccm.

36. The method of claim 24 wherein step (c), comprises:
    positioning the substrate in a deposition chamber;
    providing a gas mixture to the deposition chamber wherein the gas mixture comprises a $W(CO)_6$ precursor; and
    thermally decomposing the $W(CO)_6$ precursor to form a tungsten film on the substrate.

37. The method of claim 36 wherein the gas mixture further comprises a carrier gas.

38. The method of claim 37 wherein the carrier gas is selected from the group of argon (Ar), nitrogen ($N_2$), and combinations thereof.

39. The method of claim 36 wherein the deposition chamber is heated to a temperature of between about 250° C. to about 550° C.

40. The method of claim 36 wherein the deposition chamber is maintained at a pressure between about 0.5 torr to about 2 torr.

41. The method of claim 36 wherein $W(CO)_6$ precursor is provided to the deposition chamber at a flow rate in a range of about 2 sccm to about 20 sccm.

42. The method of claim 37 wherein the carrier gas is provided to the deposition chamber at a flow rate in a range of about 100 sccm to about 1000 sccm.

43. The method of claim 24 wherein step (c), comprises:
positioning the substrate in a deposition chamber;
providing a gas mixture to the deposition chamber wherein the gas mixture comprises a tungsten hexafluoride ($WF_6$) precursor; and
thermally decomposing the $WF_6$ precursor to form a tungsten film on the substrate.

44. The method of claim 43 wherein the gas mixture further comprises a carrier gas.

45. The method of claim 43 wherein the deposition chamber is maintained at a pressure in a range of about 300 torr to about 400 torr.

46. The method of claim 43 the $WF_6$ precursor is provided to the deposition chamber at a flow rate in a range of about 200 sccm to about 400 sccm.

47. The method of claim 44 wherein the carrier gas is selected from the group of argon (Ar), nitrogen ($N_2$), and combinations thereof.

48. The method of claim 47 wherein the carrier gas is provided to the process chamber at a flow rate in a range of about 100 sccm to about 1000 sccm.

49. The method of claim 43 wherein the process chamber is maintained at a temperature in a range of about 300° C. to about 500° C.

50. A computer storage medium containing a software routine that, when executed, causes a general purpose computer to control a deposition chamber using a layer deposition method, comprising:
(a) treating a substrate with a dielectric material thereon using a gas mixture comprising a silicon compound; and
(b) forming one or more tungsten (W) films on the substrate.

51. The computer storage medium of claim 50 wherein the silicon compound is selected from the group of silane ($SiH_4$), disilane ($Si_2H_6$), dichlorosilane ($SiCl_2H_2$), and combinations thereof.

52. The computer storage medium of claim 50 wherein the gas mixture of step (a) further comprises a carrier gas.

53. The computer storage medium of claim 52 wherein the carrier gas is selected from the group of argon (Ar), nitrogen ($N_2$), hydrogen ($H_2$), and combinations thereof.

54. The computer storage medium of claim 50 wherein step (a) is performed at a temperature in a range of about 250° C. to about 550° C.

55. The computer storage medium of claim 50 wherein step (a) is performed for a time in a range of about 5 seconds to about 30 seconds.

56. The computer storage medium of claim 50 wherein the silicon compound has a flow rate in a range of about 5 sccm to about 50 sccm.

57. The computer storage medium of claim 50 wherein step (a) is performed at a pressure in a range of about 0.5 torr to about 2 torr.

58. The computer storage medium of claim 52 wherein the carrier gas has a flow rate in a range of about 100 sccm to about 1000 sccm.

59. The computer storage medium of claim 50 wherein step (b), comprises:
positioning the substrate in a deposition chamber;
providing a gas mixture to the deposition chamber wherein the gas mixture comprises a $W(CO)_6$ precursor; and
thermally decomposing the $W(CO)_6$ precursor to form a tungsten film on the substrate.

60. The computer storage medium of claim 59 wherein the gas mixture further comprises a carrier gas.

61. The computer storage medium of claim 60 wherein the carrier gas is selected from the group of argon (Ar), nitrogen ($N_2$), and combinations thereof.

62. The computer storage medium of claim 59 wherein the deposition chamber is heated to a temperature of between about 250° C. to about 550° C.

63. The computer storage medium of claim 59 wherein the deposition chamber is maintained at a pressure between about 0.5 torr to about 2 torr.

64. The computer storage medium of claim 59 wherein $W(CO)_6$ precursor is provided to the deposition chamber at a flow rate in a range of about 2 sccm to about 20 sccm.

65. The computer storage medium of claim 60 wherein the carrier gas is provided to the deposition chamber at a flow rate in a range of about 100 sccm to about 1000 sccm.

66. The computer storage medium of claim 50 wherein step (b), comprises:
positioning the substrate in a deposition chamber;
providing a gas mixture to the deposition chamber wherein the gas mixture comprises a tungsten hexafluoride ($WF_6$) precursor; and
thermally decomposing the $WF_6$ precursor to form a tungsten film on the substrate.

67. The computer storage medium of claim 66 wherein the gas mixture further comprises a carrier gas.

68. The computer storage medium of claim 66 wherein the deposition chamber is maintained at a pressure in a range of about 300 torr to about 400 torr.

69. The computer storage medium of claim 66 the $WF_6$ precursor is provided to the deposition chamber at a flow rate in a range of about 200 sccm to about 400 sccm.

70. The computer storage medium of claim 67 wherein the carrier gas is selected from the group of argon (Ar), nitrogen ($N_2$), and combinations thereof.

71. The computer storage medium of claim 70 wherein the carrier gas is provided to the process chamber at a flow rate in a range of about 100 sccm to about 1000 sccm.

72. The computer storage medium of claim 66 wherein the process chamber is maintained at a temperature in a range of about 300° C. to about 500° C.

* * * * *